US010396742B2

(12) United States Patent
Shiozawa

(10) Patent No.: US 10,396,742 B2
(45) Date of Patent: Aug. 27, 2019

(54) RECEIVER AND NOISE SQUELCH CONTROL METHOD

(71) Applicant: JVC KENWOOD CORPORATION, Yokohama-shi, Kanagawa (JP)

(72) Inventor: Hideaki Shiozawa, Yokohama (JP)

(73) Assignee: JVC KENWOOD CORPORATION, Yokohama-Shi, Kanagawa (JP)

( * ) Notice: Subject to any disclaimer, the term of this patent is extended or adjusted under 35 U.S.C. 154(b) by 0 days.

(21) Appl. No.: 16/111,555

(22) Filed: Aug. 24, 2018

(65) Prior Publication Data
US 2019/0081605 A1 Mar. 14, 2019

(30) Foreign Application Priority Data

Sep. 12, 2017 (JP) ................. 2017-174584

(51) Int. Cl.
*H04B 1/10* (2006.01)
*H04B 17/00* (2015.01)
*H03G 3/34* (2006.01)
*H03F 3/183* (2006.01)
*H03G 3/30* (2006.01)

(52) U.S. Cl.
CPC ............ *H03G 3/344* (2013.01); *H03F 3/183* (2013.01); *H03G 3/3005* (2013.01); *H04B 1/1027* (2013.01); *H03F 2200/03* (2013.01); *H03G 2201/103* (2013.01)

(58) Field of Classification Search
CPC .. H03G 3/26; H03G 3/32; H03G 3/34; H03G 3/342; H03G 3/344; H03G 3/345; H03G 3/3005; H03G 2201/103; H04B 1/40; H04B 1/103; H04B 1/1027; H04B 17/309

USPC ... 455/63.1, 67.13, 218, 219, 221, 222, 223, 455/296
See application file for complete search history.

(56) References Cited

U.S. PATENT DOCUMENTS 3,873,926 A * 3/1975 Wright ..................... H03G 3/34
455/221
5,649,321 A * 7/1997 Kellenberger ......... H03G 3/344
455/221
5,970,399 A * 10/1999 Rostamy ................ H03G 3/344
455/222
6,374,095 B1 * 4/2002 Doyle .................... H03G 3/005
455/218

(Continued)

FOREIGN PATENT DOCUMENTS

JP         H03117927 A     5/1991

*Primary Examiner* — Quochien B Vuong
(74) *Attorney, Agent, or Firm* — Nath, Goldberg & Meyer; Jerald L. Meyer

(57) ABSTRACT

A noise squelch processor generates a noise squelch determination signal by comparing a noise level and a threshold value with each other. A carrier detector generates a carrier determination signal indicating whether or not a reception signal is present based on a signal strength of the reception signal. An integrator controller controls an integrator to set a cutoff frequency of the integrator to a second cutoff frequency higher than a first cutoff frequency at a first timing when the carrier detector generates a carrier determination signal indicating that the reception signal is present, and to switch the cutoff frequency of the integrator from the second cutoff frequency to the first cutoff frequency at a second timing after an elapse of a predetermined period from the first timing.

4 Claims, 11 Drawing Sheets

(56) References Cited

U.S. PATENT DOCUMENTS 7,505,738 B2 * 3/2009 Masaki .................... H04B 1/28
455/67.11
7,907,923 B2 * 3/2011 Hausdorf ............... H03G 3/344
455/212

* cited by examiner

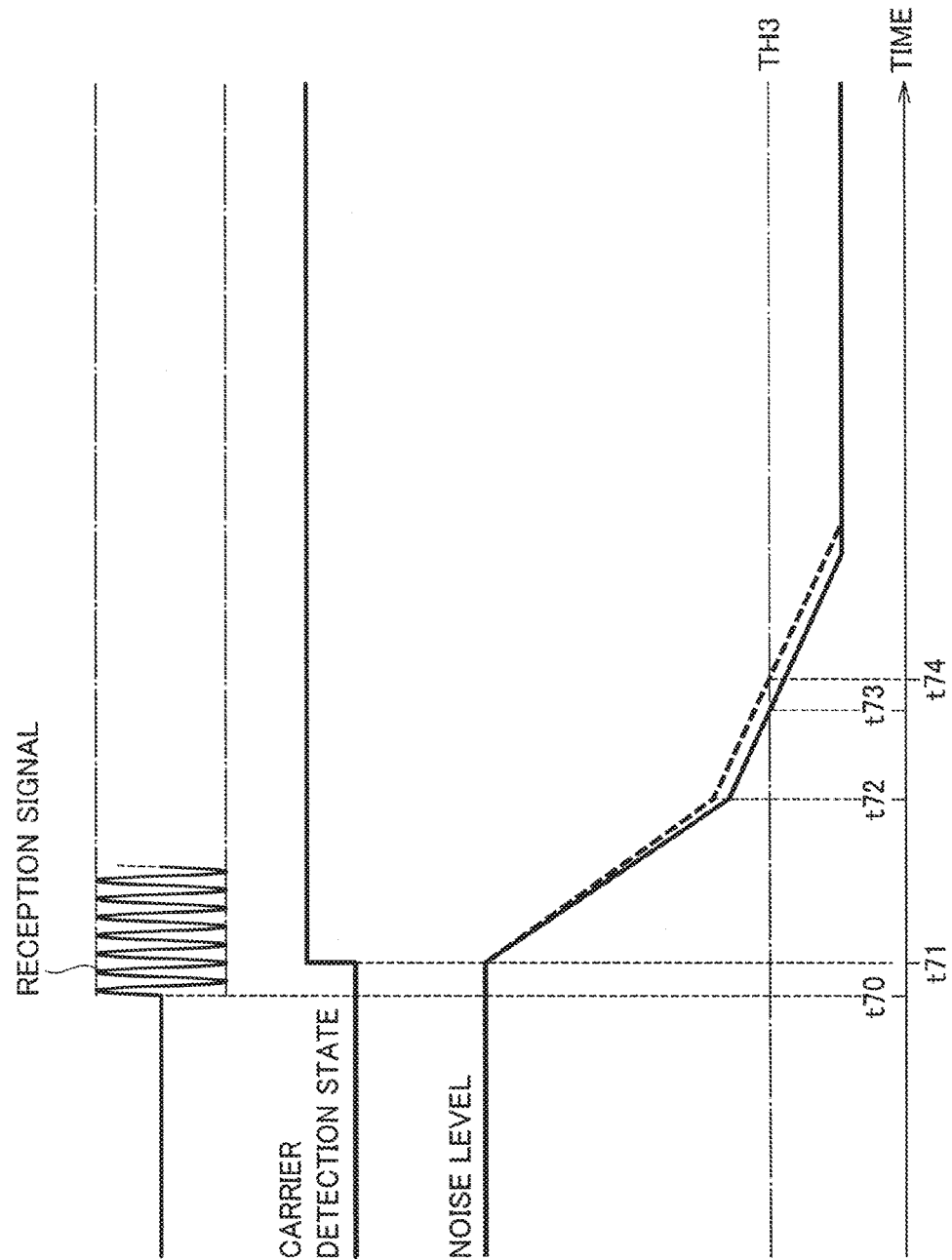

RECEIVER AND NOISE SQUELCH CONTROL METHOD

CROSS REFERENCE TO RELATED APPLICATION

This application is based upon and claims the benefit of priority under 35 U.S.C. § 119 from Japanese Patent Application No. 2017-174584 filed on Sep. 12, 2017, the entire contents of which are incorporated herein by reference.

BACKGROUND

The present disclosure relates to a receiver that receives a transmission signal transmitted by radio, and relates to a noise squelch control method for muting noises emitted from a speaker.

A receiver that receives a transmission signal transmitted by radio includes a squelch circuit that mutes noises generated when there is no reception signal (refer to Japanese Unexamined Patent Application Publication No. 03-117927 (published in 1991)). The squelch circuit generates a squelch determination signal for comparing a noise level and a predetermined threshold value with each other, muting the reception signal when the noise level is equal to or greater than the threshold value, and unmuting the reception signal when the noise level is less than the threshold value.

SUMMARY

If the threshold value is set high, the receiver sensitivity increases; however, noises increase since the reception signal tends to be unmuted even when an electric field is weak. Therefore, if the threshold value is set low, then the receiver sensitivity decreases, and the latency of a voice is lengthened.

A first aspect of one or more embodiments provides a receiver including: a noise squelch processor configured to generate a noise level decreasing from an initial value to a predetermined convergence value by integrating, by an integrator composed of a low-pass filter, a rectified signal obtained by extracting and rectifying a signal outside a band of a voice in a detection signal, obtained by detecting a reception signal to determine whether a voice signal is to be muted or unmuted by comparing the noise level and a threshold value with each other, and to generate a noise squelch determination signal; a carrier detector configured to generate a carrier determination signal indicating whether or not the reception signal is present based on a signal strength of the reception signal; an audio controller configured to supply a voice signal generated based on the detection signal to a speaker; an audio mute determiner configured to instruct the audio controller to mute the voice signal when the noise squelch determination signal indicates that the voice signal is to be muted; and an integrator controller configured to control the integrator to set a cutoff frequency of the integrator to a second cutoff frequency higher than a first cutoff frequency at a first timing when the carrier detector generates a carrier determination signal indicating that the reception signal is present, and to switch the cutoff frequency of the integrator from the second cutoff frequency to the first cutoff frequency at a second timing after an elapse of a predetermined period from the first timing.

A second aspect of one or more embodiments provides a noise squelch control method including: generating a rectified signal obtained by extracting and rectifying a signal outside a band of a voice in a detection signal obtained by detecting a reception signal; generating a noise level decreasing from an initial value to a predetermined convergence value by integrating the rectified signal by an integrator composed of a low-pass filter; determining whether to mute or unmute a voice signal by comparing the noise level and a threshold value with each other and generating a noise squelch determination signal; generating a carrier determination signal indicating whether or not a reception signal is present based on a signal strength of the reception signal; instructing an audio controller to mute a voice signal generated based on the detection signal when the noise squelch determination signal indicates that the voice signal is to be muted, the audio controller supplying the voice signal to a speaker; setting a cutoff frequency of the integrator to a second cutoff frequency higher than a first cutoff frequency at a first timing when a carrier determination signal indicating that the reception signal is present; and switching the cutoff frequency of the integrator from the second cutoff frequency to the first cutoff frequency at a second timing after an elapse of a predetermined period from the first timing.

BRIEF DESCRIPTION OF THE DRAWINGS

FIG. 11 is a diagram illustrating operations of the receiver 200 according to a second embodiment and a noise squelch control method according to a second embodiment.

DETAILED DESCRIPTION

Hereinafter, a description will be given of receivers and noise squelch control methods according to the respective embodiments with reference to the accompanying drawings.

First Embodiment

Figure 1:
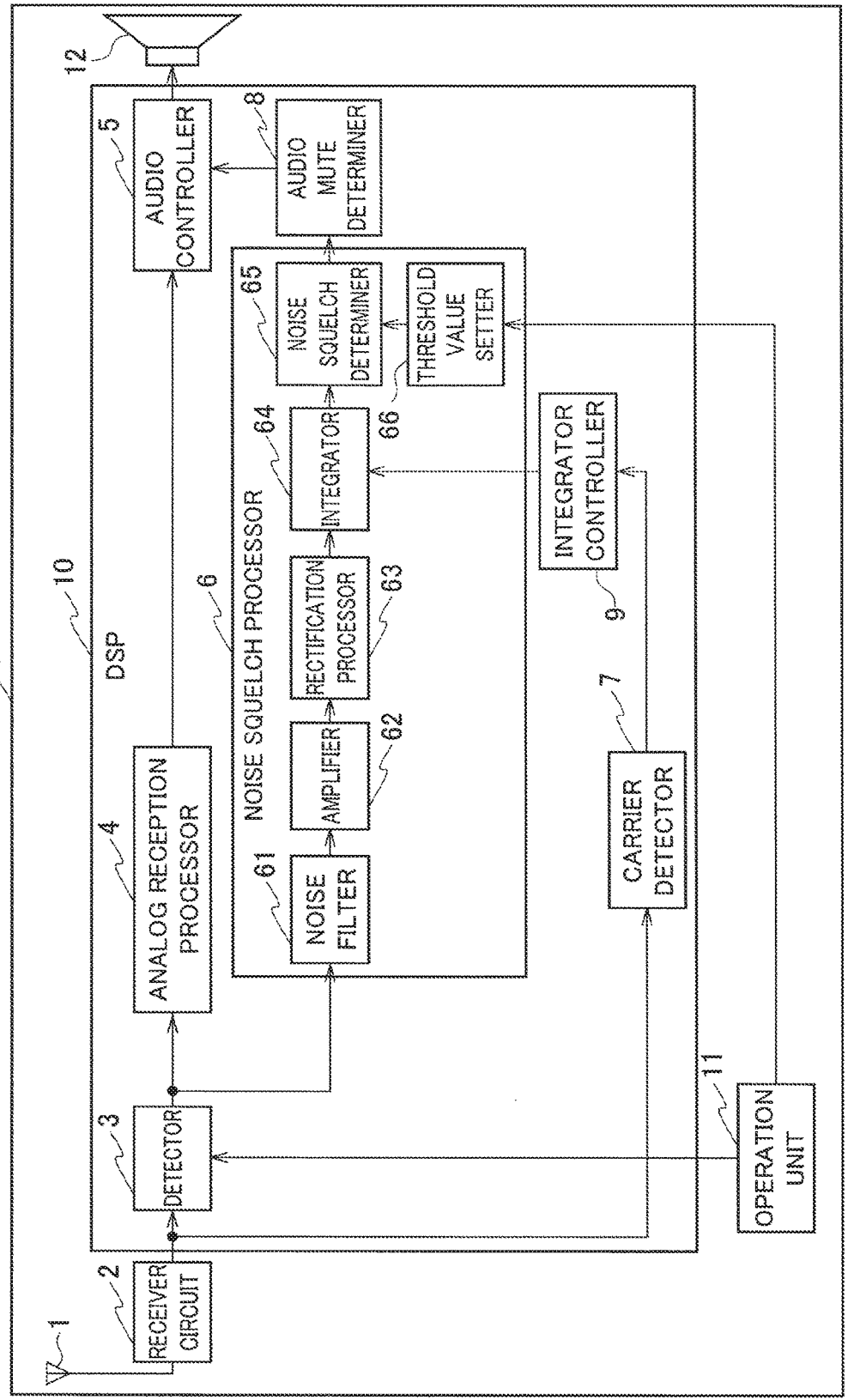
FIG. 1 is a block diagram illustrating a receiver 100 according to a first embodiment.

FIG. 1 is a block diagram showing a receiver 100 according to a first embodiment. In FIG. 1, the receiver 100 receives a transmission signal transmitted by radio from an unillustrated transmitter. The transmission signal is an FM wave, for example. The received transmission signal is a reception signal in the receiver 100. An antenna 1 supplies the reception signal to a receiver circuit 2. The receiver circuit 2 supplies the reception signal, which is supplied from the antenna 1, to a digital signal processor (DSP) 10.

The DSP 10 includes, as functional constituents, a detector 3, an analog reception processor 4, an audio controller 5, a noise squelch processor 6, a carrier detector 7, an audio mute determiner 8, and an integrator controller 9. The noise squelch processor 6 includes a noise filter 61, an amplifier 62, a rectification processor 63, an integrator 64, a noise squelch determiner 65, and a threshold value setter 66.

Here, the DSP 10 is operated by software (computer program), whereby the detector 3 to the integrator controller 9 are constituted; however, a central processing unit (CPU) of a microcomputer may be used in place of the DSP 10. Moreover, the detector 3 to the integrator controller 9 may be constituted by a circuit made of hardware. The detector 3 to the integrator controller 9 may be constituted by mixing the software and the hardware.

The detector 3 detects (demodulates) a reception signal in a predetermined channel selected by the operation unit 11, and generates a baseband detection signal. The analog reception processor 4 performs filtering processing for extracting a voice signal and a variety of signaling decoding processing, and supplies the voice signal to the audio controller 5. For example, the analog reception processor 4 extracts a band up to 3 kHz as a band of a voice in the detection signal.

The audio controller 5 adjusts a gain of the voice signal and supplies the voice signal to a speaker 12. When a mute instruction signal is supplied from the audio mute determiner 8 to be described later, the audio controller 5 mutes the voice signal by not supplying the voice signal to the speaker 12.

The noise filter 61 is composed of a band-pass filter (BPF), and extracts a signal outside the band of the voice in the received detection signal. For example, the noise filter 61 extracts a band equal to or greater than the band of the voice (3 kHz or more) in the detection signal. The amplifier 62 amplifies the signal extracted by the noise filter 61, and adjusts a gain of the extracted signal. The amplifier 62 is a configuration of a design matter for the receiver 100.

The rectification processor 63 rectifies the signal supplied from the amplifier 62. The integrator 64 is composed of a low-pass filter (LPF), and integrates such a rectified signal supplied from the rectification processor 63. An output of the integrator 64 indicates a noise level of the signal outside the band of the voice.

Figure 2:
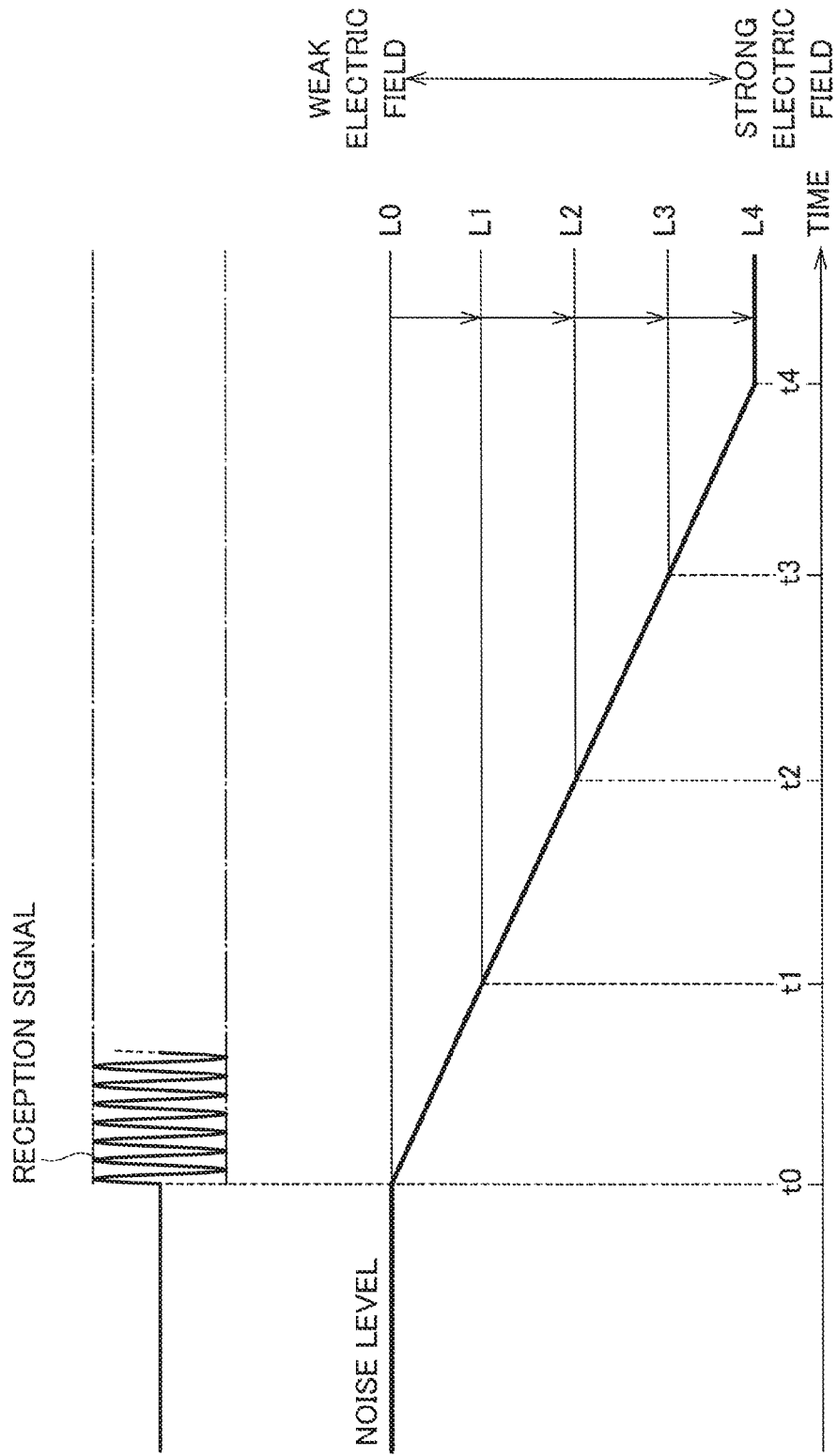
FIG. 2 is a diagram illustrating a noise level in which a convergence value is changed in response to the field strength.

The noise level outputted from the integrator 64 will be described with reference to FIG. 2. In FIG. 2, it is assumed that the input of the reception signal is started to the receiver 100 at time t0. When the field strength of the reception signal is a weak electric field, the noise level is kept at an initial value thereof having a high level L0. When the field strength of the reception signal becomes a little stronger than the weak electric field, the noise level decreases from the initial value and converges to a certain level L1 at time t1.

When the field strength of the reception signal becomes much stronger, the noise level decreases from the initial value and converges to a certain level L2 at time t2. When the field strength of the reception signal becomes much stronger, the noise level decreases from the initial value and converges to a certain level L3 at time t3. When the field strength of the reception signal becomes much stronger, the noise level decreases from the initial value and converges to a certain level L4 at time t4.

In this way, the integrator 64 generates the noise level that decreases from the initial value to predetermined convergence values. The noise level has such convergence values that are different in response to the field strength of the reception signal, and also has different periods since the input of the reception signal is started for the receiver 100 to the timing when the noise level decreases to each of the convergence values.

The integrator 64 supplies the noise level as shown in FIG. 2 to the noise squelch determiner 65. In response to the threshold value set by the threshold value setter 66, the noise squelch determiner 65 generates a noise squelch determination signal indicating whether to mute or unmute the voice signal. The noise squelch determination signal is supplied to the audio mute determiner 8. Operations of the integrator controller 9 will be described later.

The carrier detector 7 detects a received signal strength indicator (RSSI) of the reception signal received by the receiver circuit 2. Based on the detected RSSI, the carrier detector 7 generates a carrier determination signal indicating whether or not the reception signal is present. The carrier determination signal is supplied to the integrator controller 9.

When the noise squelch determination signal indicates that the voice signal is to be muted, the audio mute determiner 8 supplies the mute instruction signal to the audio controller 5, and instructs the audio controller 5 to mute the voice signal.

Figure 3:
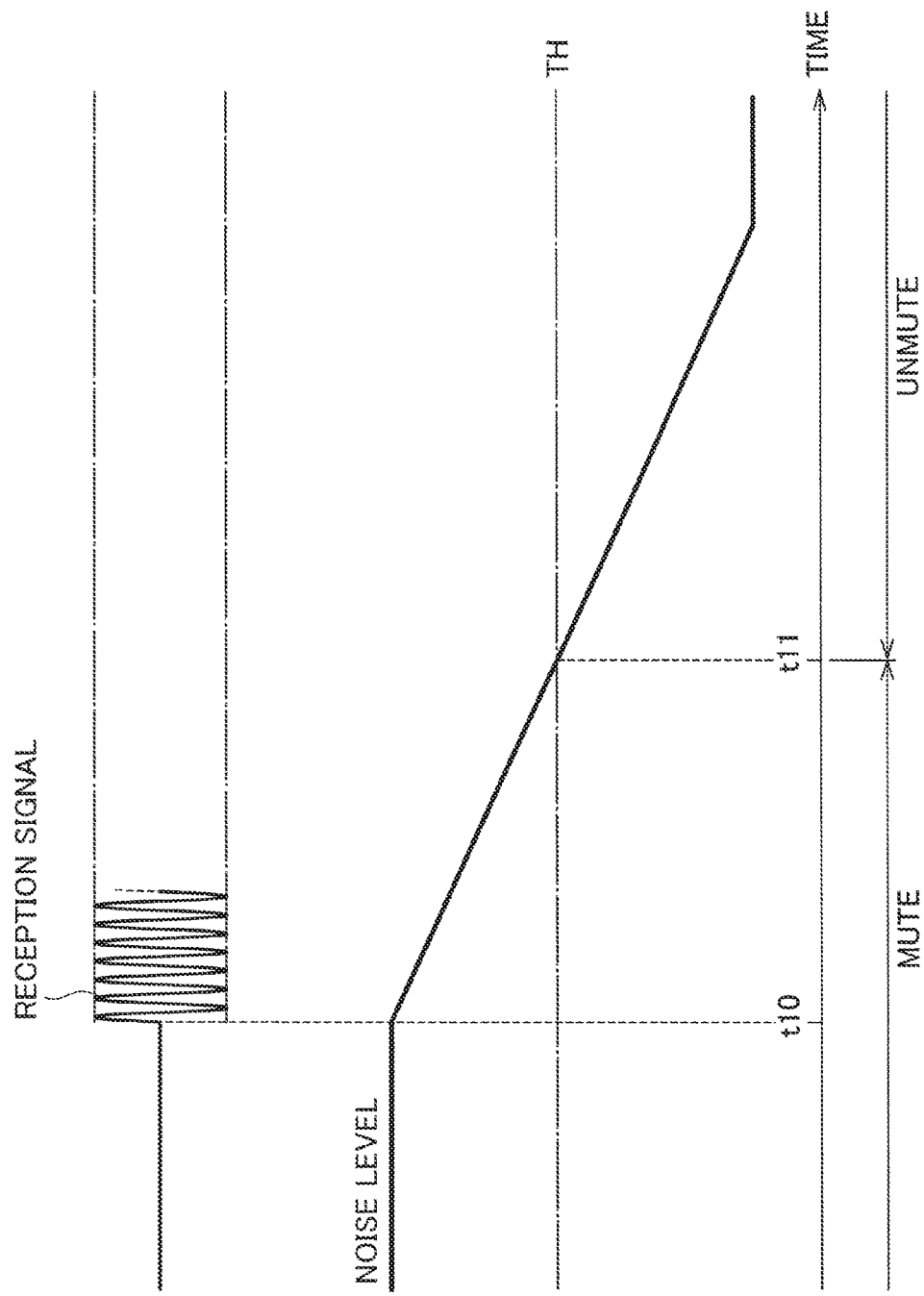
FIG. 3 is a diagram illustrating a typical operation of a noise squelch processor.

FIG. 3 shows a typical operation of the noise squelch processor 6. It is assumed that the threshold value is set to TH. When the input of the reception signal is started for the receiver 100 at time t10, the noise level decreases linearly to the convergence value if the field strength is constant. The noise squelch determiner 65 determines that the noise level is equal to or greater than the threshold value TH until time t11, and accordingly, generates the noise squelch determination signal indicating that the voice signal is to be muted.

After time t11, the noise level becomes less than the threshold value TH. Accordingly, the noise squelch determiner 65 generates a noise squelch determination signal indicating that the voice signal is to be unmuted.

Figure 4:
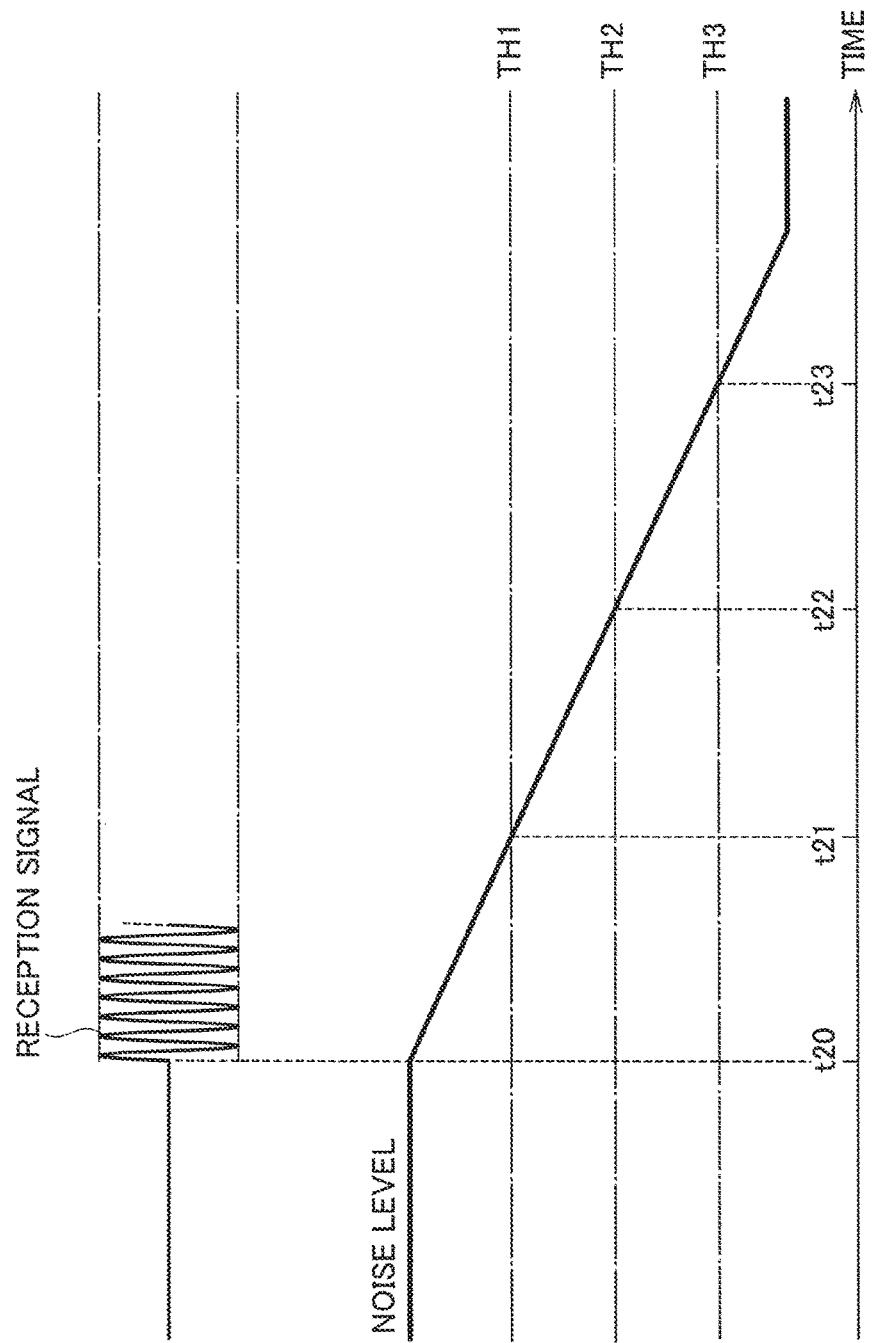
FIG. 4 is a diagram illustrating an operation of the noise squelch processor when a threshold value to be compared with the noise level is differentiated in three steps.

FIG. 4 shows an operation of the noise squelch processor 6 when the threshold value TH is differentiated in three steps, for example. When the threshold value TH is set to a high-level threshold value TH1, the noise squelch determiner 65 determines that the noise level is equal to or greater than the threshold value TH1 until time t21, and accordingly, generates the noise squelch determination signal indicating that the voice signal is to be muted. After time t21, the noise squelch determiner 65 generates a noise squelch determination signal indicating that the voice signal is to be unmuted.

When the threshold value TH is set to a middle-level threshold value TH2, the noise squelch determiner 65 determines that the noise level is equal to or greater than the threshold value TH2 until time t22, and accordingly, generates the noise squelch determination signal indicating that the voice signal is to be muted. After time t22, the noise squelch determiner 65 generates the noise squelch determination signal indicating that the voice signal is to be unmuted.

When the threshold value TH is set to a low-level threshold value TH3, the noise squelch determiner 65 determines that the noise level is equal to or greater than the threshold value TH3 until time t23, and accordingly, generates the noise squelch determination signal indicating that the voice signal is to be muted. After time t23, the noise squelch determiner 65 generates the noise squelch determination signal indicating that the voice signal is to be unmuted.

When the threshold value TH is set high like the threshold value TH1, then the latency of the voice is shortened, and when the threshold value TH is set low like the threshold value TH3, then the latency of the voice is lengthened. The latency is the time in which the beginning of the voice cannot be reproduced. Thus, as the threshold value TH is lowered, the timing at which the sound is output from the speaker 12 is delayed, and the latency of the voice is lengthened.

The threshold value setter 66 may set the threshold value TH for each of the received channels. The threshold value setter 66 only needs to set the threshold value TH in the noise squelch determiner 65 in response to the channel selected by the operation unit 11.

Next, a description will be given of operations of the receiver 100 and the noise squelch control method according to a first embodiment, which can shorten the latency of the voice even when the threshold value TH is set to such a low value.

As shown in FIG. 1, the carrier detector 7 supplies the carrier determination signal to the integrator controller 9. The integrator controller 9 can control the integrator 64 to set, at an appropriate frequency, a cutoff frequency of the LPF that composes the integrator 64.

Figure 5:
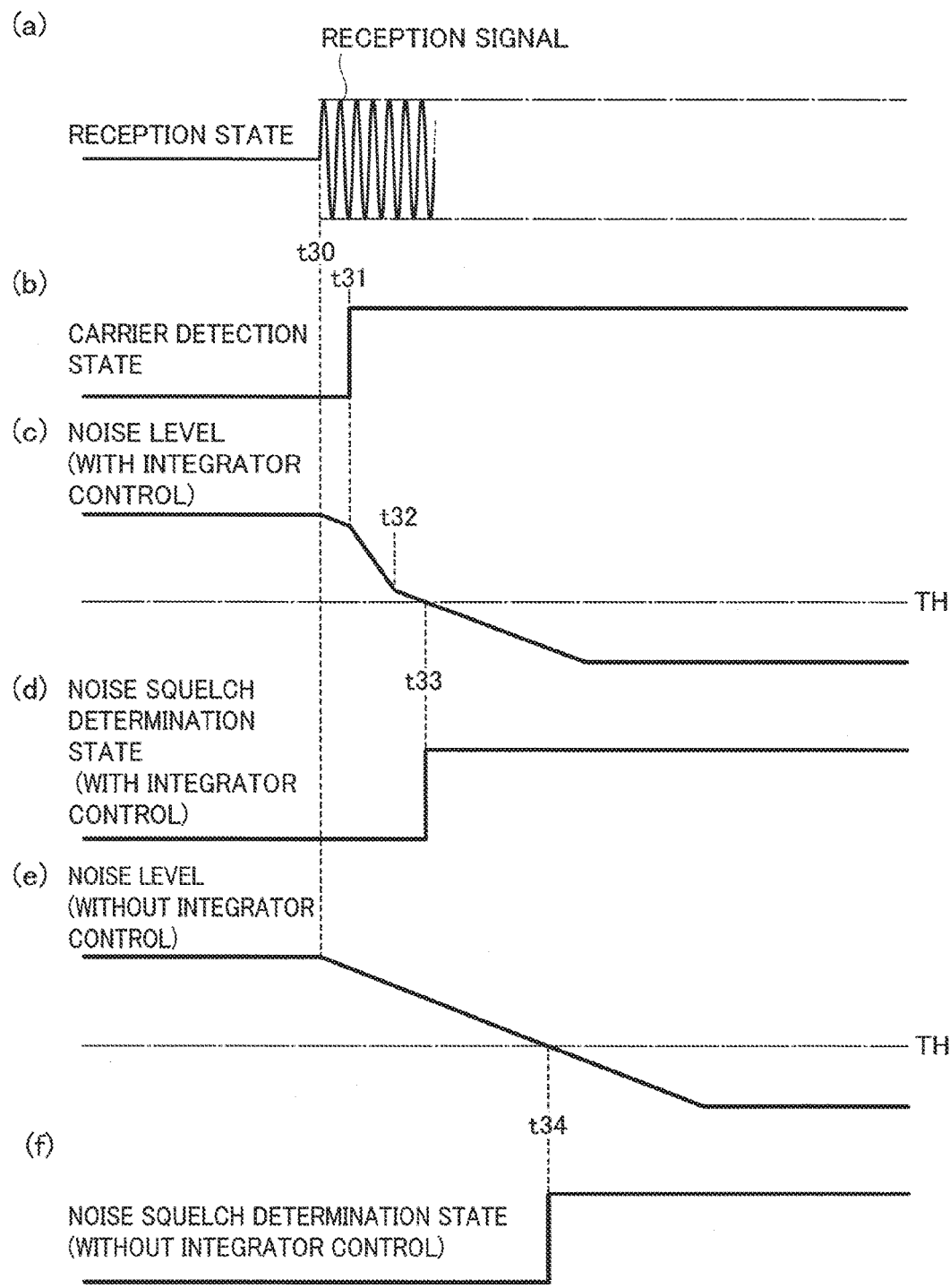
FIG. 5 is a diagram illustrating operations of the receiver 100 according to a first embodiment and a noise squelch control method according to a first embodiment.

In FIG. 5, as shown in (a), when the input of the reception signal is started at time t30 for the receiver 100, the signal strength of the reception signal is a predetermined value or more at that time. Accordingly, as shown in (b), the carrier detector 7 generates the carrier determination signal, which rises from low to high, at time t31 slightly later than time t30. In such a high state, the carrier determination signal indicates that the reception signal is present, and in such a low state, the carrier determination signal indicates that the reception signal is not present.

For the integrator 64, in an initial state thereof, a first cutoff frequency is set by the integrator controller 9. As shown in (c) of FIG. 5, the noise level output by the integrator 64 decreases at a predetermined inclination angle when the input of the reception signal is started at time t30 for the receiver 100 as described with reference to FIGS. 2 to 4.

When the carrier determination signal rises from low to high at time t31, the integrator controller 9 sets a second cutoff frequency higher than the first cutoff frequency for the integrator 64. The rise from low to high in the carrier determination signal supplied from the integrator controller 9 serves as a trigger for switching the cutoff frequency of the LPF that composes the integrator 64.

Then, as shown in (c) of FIG. 5, on and after time t31, the inclination of the noise level becomes larger than during a period from time t30 to time t31. The inclination of the noise level when the noise level decreases toward the convergence value becomes larger as the cutoff frequency in the integrator 64 is made larger.

At time t32, the integrator controller 9 sets the first cutoff frequency for the integrator 64 again. Then, on and after time t32, the noise level decreases at the same inclination angle as the inclination angle in the period from time t30 to time t31.

After time t33, the noise level becomes less than the threshold value TH. Accordingly, the noise squelch determiner 65 generates a noise squelch determination signal, which rises from low to high, at time t33 as shown in (d) of FIG. 5. When the signal is low, the noise squelch determination signal indicates that the voice signal is muted, and when the signal is high, the noise squelch determination signal indicates that the voice signal is unmuted.

For comparison, (e) and (f) of FIG. 5 show a noise level and a noise squelch determination signal when the cutoff frequency set for the integrator 64 is set to a certain value of the first cutoff frequency. In (e) of FIG. 5, after time t34, the noise level becomes less than the threshold value TH, the noise squelch determiner 65 generates a noise squelch determination signal, which rises from low to high, at time t34 as shown in (f) of FIG. 5.

As seen from a comparison between (d) and (f) of FIG. 5, in accordance with the receiver 100 and the noise squelch control method according to a first embodiment, the noise squelch determiner 65 generates the noise squelch determination signal, which indicates that the voice signal is unmuted, at time t33 earlier than time t34, and accordingly, the latency of the voice can be shortened.

In FIG. 5, the integrator controller 9 returns the cutoff frequency to the first cutoff frequency after switching the cutoff frequency to the second cutoff frequency for a period from time t31 to time t32; however, the integrator controller 9 does not need to return the cutoff frequency to the first cutoff frequency.

However, returning of the cutoff frequency to the first cutoff frequency has such an advantage as follows. If the change of the noise level when the noise level decreases is large, then the reaction in which the noise squelch processor 6 generates the noise squelch determination signal becomes faster. Therefore, in some cases, the voice may be muted frequently in response to the change of the noise level. The cutoff frequency is returned to the first cutoff frequency, which is low, whereby such unnecessary muting of the voice is eliminated even when the noise level is slightly changed.

Figure 6:
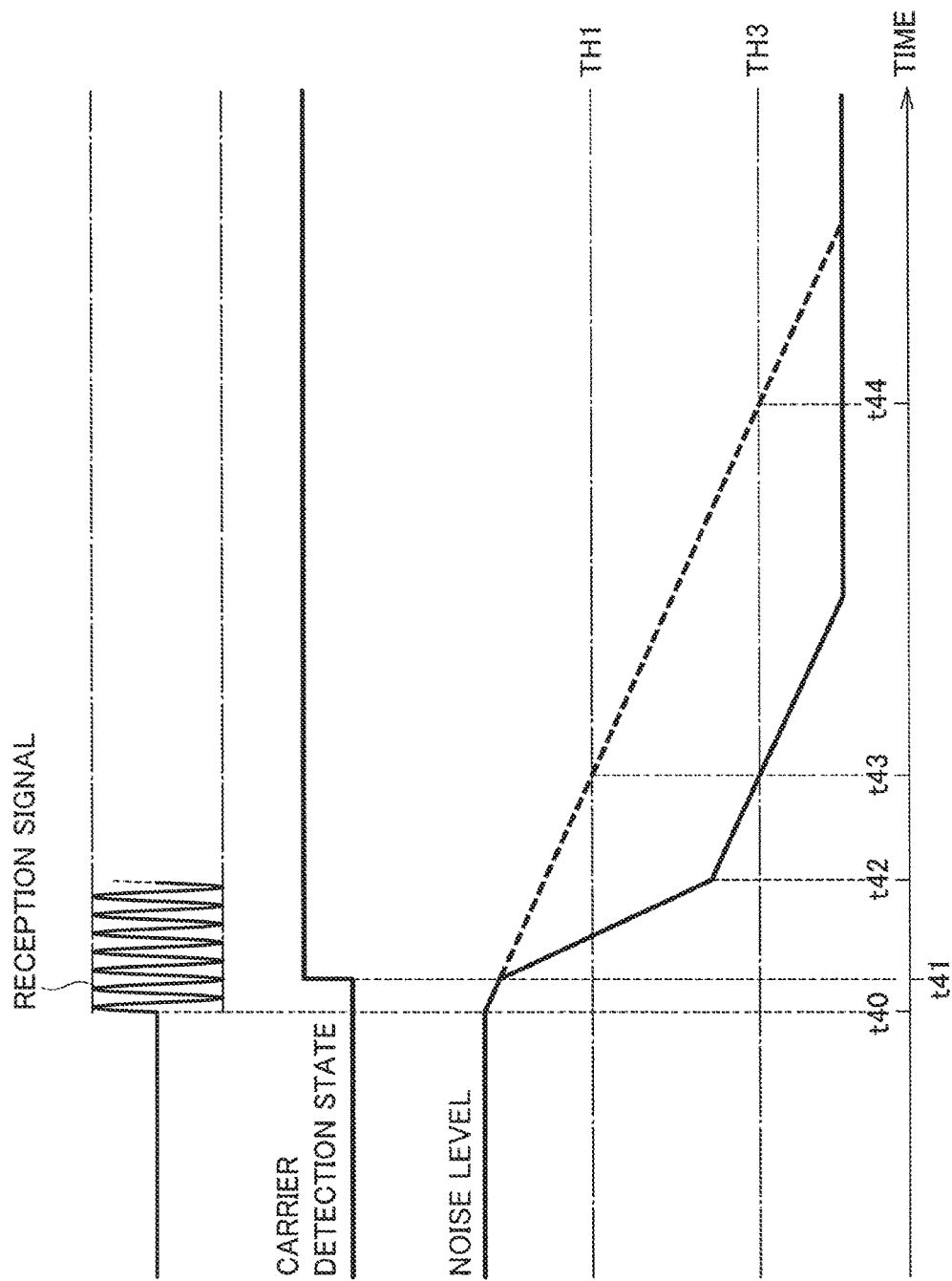
FIG. 6 is a diagram illustrating an example of adjusting a latency of a voice to the same time by two threshold values.

Moreover, a description will be given of a specific example of a method for setting the cutoff frequency of the integrator 64 by the integrator controller 9. In FIG. 6, the input of the reception signal is started for the receiver 100 at time t40, and the carrier determination signal becomes high at time t41. In the channel in which the threshold value TH is set to TH1, the latency of the voice is short. Accordingly, the integrator controller 9 sets the cutoff frequency of the integrator 64 fixedly to the first cutoff frequency.

In this case, the noise level decreases linearly as shown by a broken line, and after time t43, the threshold value TH becomes less than the threshold value TH1. Accordingly, the noise squelch determiner 65 generates the noise squelch determination signal, which rises from low to high.

In the channel in which the threshold value TH is set to TH3, the integrator controller 9 switches the cutoff frequency of the integrator 64 from the first cutoff frequency to the second cutoff frequency at time t41 when the carrier determination signal becomes high. The integrator controller 9 returns the cutoff frequency of the integrator 64 to the first cutoff frequency at time t42 after the cutoff frequency of the integrator 64 is switched to the second cutoff frequency for a predetermined period from time t41.

At this time, it is preferable to set a value of the second cutoff frequency and the period while the cutoff frequency is set to the second cutoff frequency in such a way that timing when the noise level becomes less than the threshold value TH3 coincides with time t43. In this way, the latency of the voice can be set to the same time between the channel in which the threshold value TH is set to TH1 and the channel in which the threshold value TH is set to TH3. Accordingly, a user is unlikely to feel uncomfortable.

In FIG. 6, in the channel in which the threshold value TH is set to TH3, when the cutoff frequency of the integrator 64 is fixed to the first cutoff frequency, the noise squelch determiner 65 generates the noise squelch determination signal, which rises from low to high, at time t44. In accordance with the receiver 100 and the noise squelch control method according to a first embodiment, the latency of the voice can be shortened by a period from time t43 to time t44.

Figure 7:
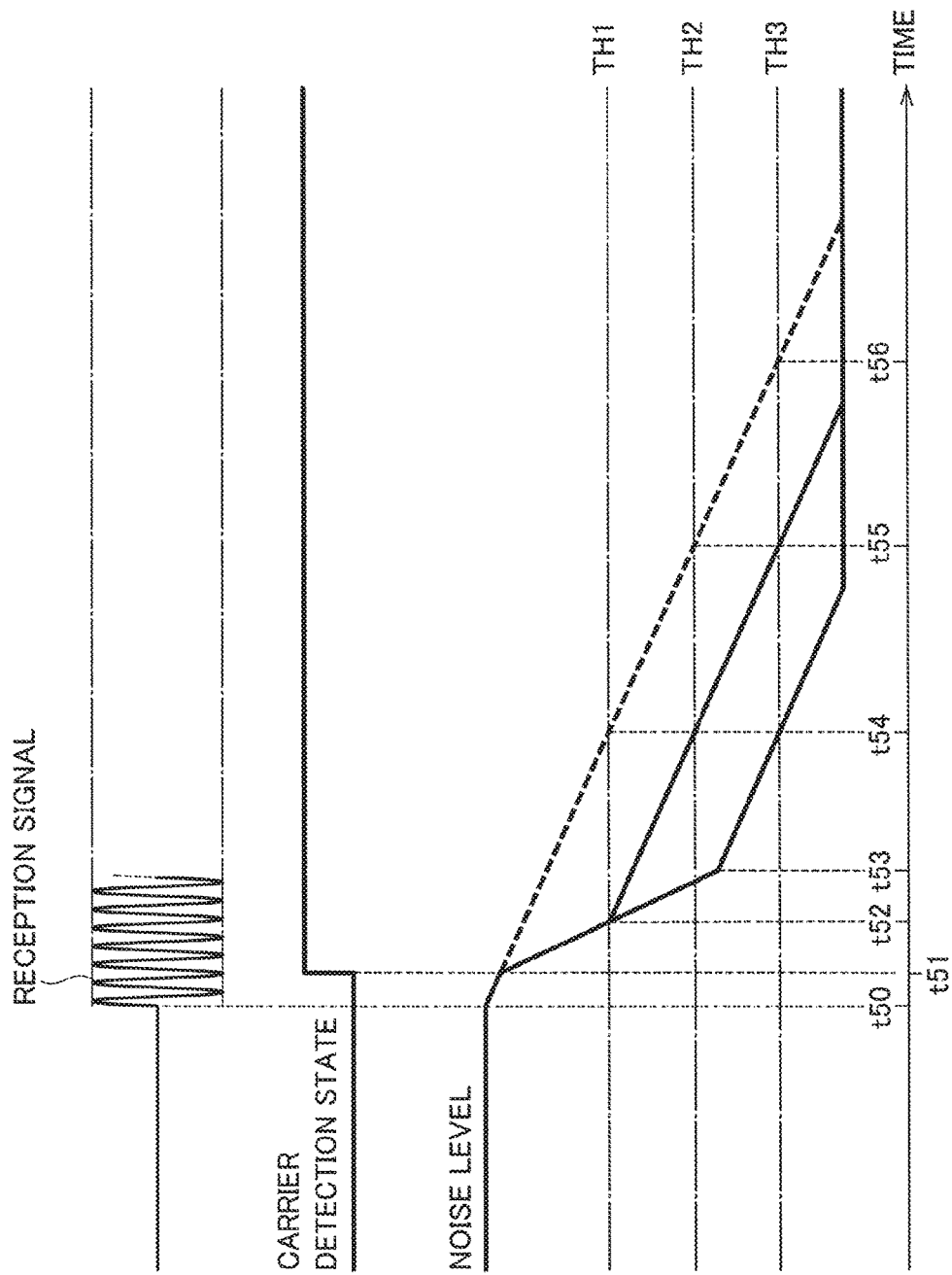
FIG. 7 is a diagram illustrating a first example of adjusting a latency of a voice to the same time by three threshold values.

FIG. 7 shows a case in which the threshold value TH is set to three types, which are TH1 to TH3 for each of the channels, and the latency of the voice is consistent among the channels by differentiating the period of setting the cutoff frequency of the integrator 64 to the second cutoff frequency.

In FIG. 7, the input of the reception signal is started for the receiver 100 at time t50, and the carrier determination signal becomes high at time t51. In the channel in which the threshold value TH is set to TH1, the integrator controller 9 sets the cutoff frequency of the integrator 64 fixedly to the first cutoff frequency.

In this case, the noise level decreases linearly as shown by a broken line, and after time t54, the threshold value TH becomes less than the threshold value TH1. Accordingly, the noise squelch determiner 65 generates the noise squelch determination signal, which rises from low to high.

In the channel in which the threshold value TH is set to TH2, the integrator controller 9 switches the cutoff frequency of the integrator 64 from the first cutoff frequency to the second cutoff frequency at time t51, when the carrier determination signal becomes high. At time t52, the integrator controller 9 returns the cutoff frequency of the integrator 64 to the first cutoff frequency.

The noise squelch determiner 65 generates the noise squelch determination signal, which rises from low to high, at time t54 when the noise level becomes less than the threshold value TH2.

In a similar way, in the channel in which the threshold value TH is set to TH3, the integrator controller 9 switches the cutoff frequency of the integrator 64 from the first cutoff frequency to the second cutoff frequency at time t51. At time t53, the integrator controller 9 returns the cutoff frequency of the integrator 64 to the first cutoff frequency.

The noise squelch determiner 65 generates the noise squelch determination signal, which rises from low to high, at time t54 when the noise level becomes less than the threshold value TH3.

In this way, the timing of generating the noise squelch determination signal indicating that the voice signal is to be unmuted is consistent among all the channels in which the threshold value TH is set to TH1 to TH3, and accordingly, the latency of the voice can be set to the same time. Hence, the user is unlikely to feel uncomfortable.

In FIG. 7, in comparison with a case in which the cutoff frequency is fixed to the first cutoff frequency, when the threshold value TH is set to TH2, the latency of the voice can be shortened by the period from time t54 to time t55. In comparison with the case in which the cutoff frequency is fixed to the first cutoff frequency, when the threshold value TH is set to TH3, the latency of the voice can be shortened by the period from time t54 to time t56.

In FIG. 7, when the threshold values TH1 to TH3 are set at equal intervals and the second cutoff frequency is set to four times the first cutoff frequency, then the latency of the voice can be set to the same time in the following steps.

(Step 1) In a state in which the cutoff frequency of the integrator 64 is set to the first cutoff frequency, a designer measures a difference between the timing (time t54) when the noise squelch determination signal becomes high in the case of the threshold value TH1 and the timing (time t55) when the noise squelch determination signal becomes high in the case of the threshold value TH2.

(Step 2) The designer sets the cutoff frequency of the integrator 64 to the second cutoff frequency.

(Step 3) In such a state in which the second cutoff frequency is set in the integrator 64, the designer adjusts the period, which is set for the second cutoff frequency, so that the timing when the noise squelch determination signal becomes high in the case of the threshold value TH2 becomes substantially equivalent to time t54.

(Step 4) The designer determines that a period obtained by doubling the period, which is obtained in Step 3 and set for the second cutoff frequency, will be a period while the second cutoff frequency is set for the integrator 64 in the case of the threshold value TH3.

Figure 8:
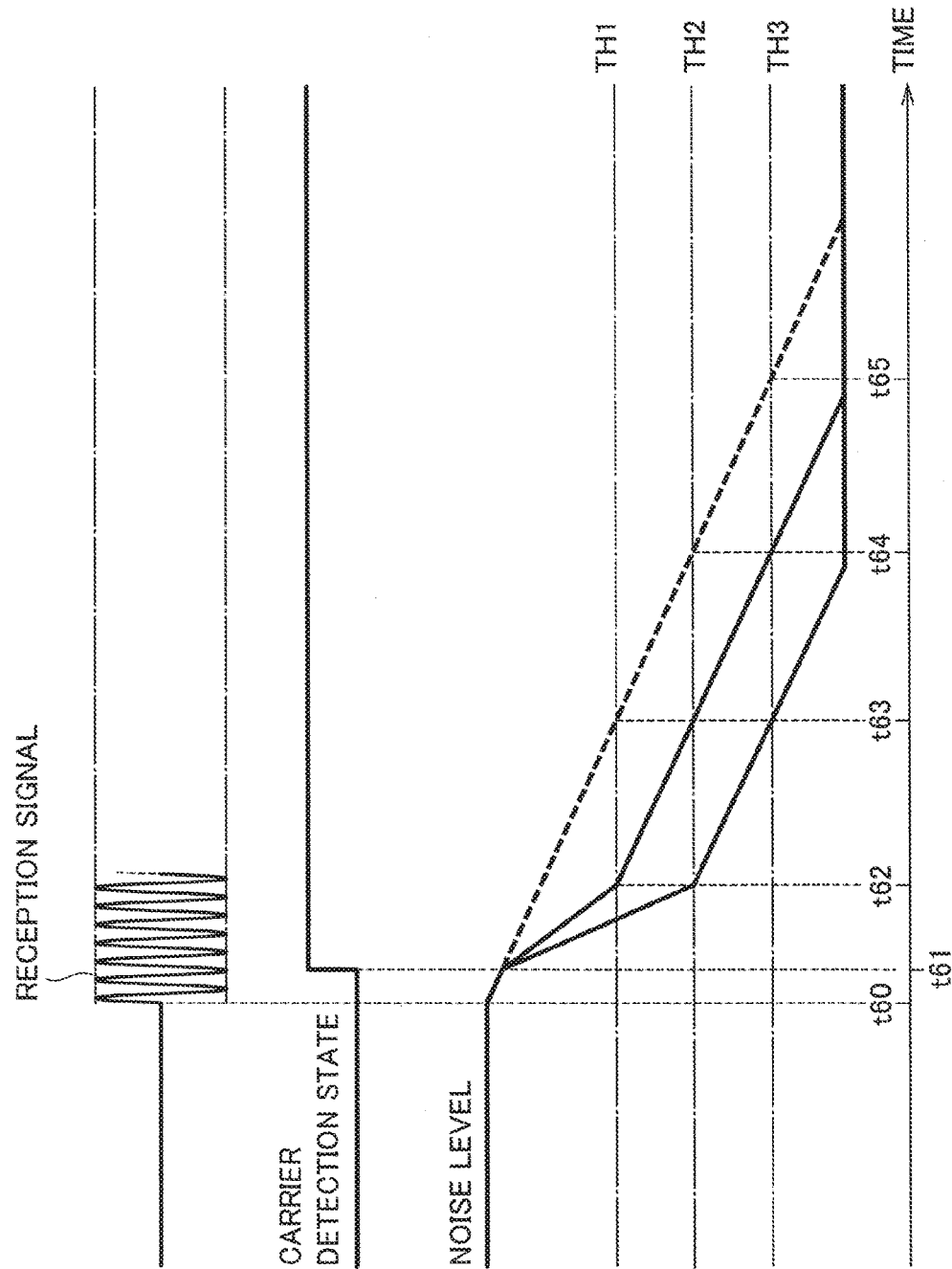
FIG. 8 is a diagram illustrating a second example of adjusting a latency of a voice to the same time by three threshold values.

FIG. 8 shows a case in which the threshold value TH is set to three types which are TH1 to TH3 for each of the channels, and the latency of the voice is consistent among the channels by setting the cutoff frequency of the integrator 64 to a plurality of cutoff frequencies, as well as the first cutoff frequency.

In FIG. 8, the input of the reception signal is started for the receiver 100 at time t60, and the carrier determination signal becomes high at time t61. In the channel in which the threshold value TH is set to TH1, the integrator controller 9 sets the cutoff frequency of the integrator 64 fixedly to the first cutoff frequency.

In this case, the noise level decreases linearly as shown by a broken line, and after time t63, the threshold value TH becomes less than the threshold value TH1. Accordingly, the noise squelch determiner 65 generates the noise squelch determination signal, which rises from low to high.

In the channel in which the threshold value TH is set to TH2, the integrator controller 9 switches the cutoff frequency of the integrator 64 from the first cutoff frequency to the second cutoff frequency at time t61 when the carrier determination signal becomes high. At time t62, the integrator controller 9 returns the cutoff frequency of the integrator 64 to the first cutoff frequency.

Note that the second cutoff frequency in FIG. 8 is not necessarily the same as the second cutoff frequency in FIG. 7.

The noise squelch determiner 65 generates the noise squelch determination signal, which rises from low to high, at time t63 when the noise level becomes less than the threshold value TH2.

In a similar way, in the channel in which the threshold value TH is set to TH3, the integrator controller 9 switches the cutoff frequency of the integrator 64 from the first cutoff frequency to the third cutoff frequency at time t61. The third cutoff frequency is higher than the second cutoff frequency. At time t62, the integrator controller 9 returns the cutoff frequency of the integrator 64 to the first cutoff frequency.

The noise squelch determiner 65 generates the noise squelch determination signal, which rises from low to high, at time t63 when the noise level becomes less than the threshold value TH3.

In this way, the timing of generating the noise squelch determination signal indicating that the voice signal is to be unmuted is consistent among all the channels in which the threshold value TH is set to TH1 to TH3, and accordingly, the latency of the voice can be set to the same time. Hence, the user is unlikely to feel uncomfortable.

In FIG. 8, in comparison with the case in which the cutoff frequency is fixed to the first cutoff frequency, when the threshold value TH is set to TH2, the latency of the voice can be shortened by the period from time t63 to time t64. In comparison with the case in which the cutoff frequency is fixed to the first cutoff frequency, when the threshold value TH is set to TH3, the latency of the voice can be shortened by the period from time t63 to time t65.

Incidentally, in FIGS. 7 and 8, as a reference, such a case is taken where the first cutoff frequency is fixedly set for the integrator 64 in the channel in which the threshold value TH is set to TH1. Then, a period while the cutoff frequency is set high, or a value of the cutoff frequency is set so that the latency of the voice in the channel in which the threshold value TH is set to TH2 or TH3 is allowed to coincide with such a reference latency.

In all the channels in which the threshold value TH is set to TH1 to TH3, the period while the cutoff frequency is set high or the value of the cutoff frequency is set, whereby the latency of the voice in the respective channels may be allowed to coincide with one another.

In accordance with the receiver 100 and the noise squelch control method according to a first embodiment, it is also possible to shorten the time required for channel scanning. The channel scanning is a function to sequentially switch channels to be received and to receive a channel from which a voice signal can be generated within a predetermined time-out period.

Figure 9:
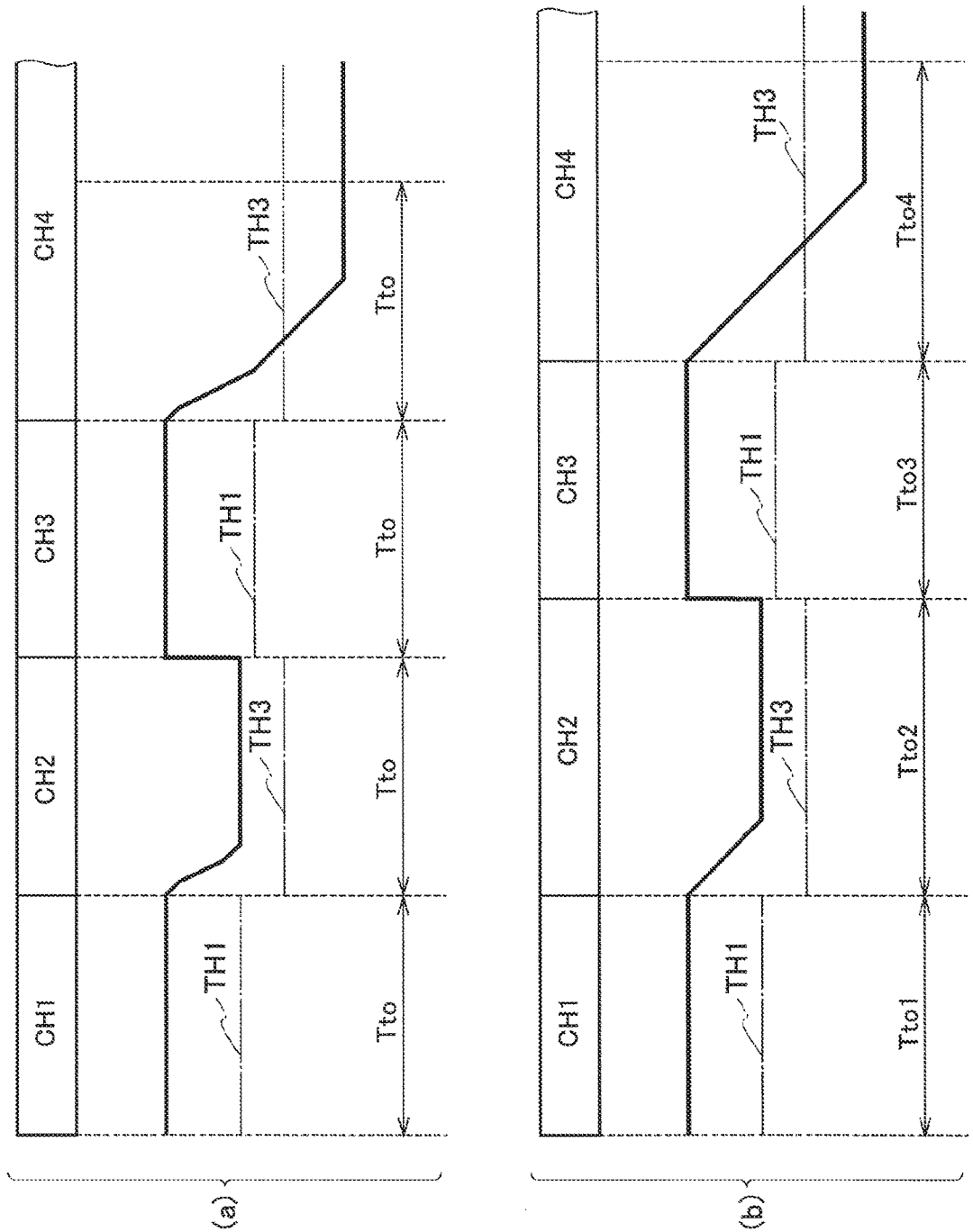
FIG. 9 is a diagram for comparing channel scanning by the receiver 100 according to a first embodiment and channel scanning by a conventional receiver with each other.

With reference to FIG. 9, the channel scanning by the receiver 100 according to a first embodiment, and the channel scanning by a conventional receiver are compared with each other. In FIG. 9, (a) shows the channel scanning by the receiver 100 according to a first embodiment, and (b) shows the channel scanning by a conventional receiver.

In the conventional receiver, as described with reference to FIG. 4, the lower the threshold value TH is, the later the timing of generating the noise squelch determination signal indicating that the voice signal is to be unmuted. Hence, in the conventional receiver, it is necessary to set the time-out period in response to the level of the threshold value TH.

In (a) and (b) of FIG. 9, it is assumed that the threshold value TH is set to the threshold value TH1 at the receiving time of channels 1 and 3 (CH1 and CH3), and that the threshold value TH is set to the threshold value TH3 at a receiving time of channels 2 and 4 (CH2 and CH4).

In (b) of FIG. 9, the time-out period is set to Tto1 in CH1, Tto3 in CH3, Tto2 in CH2, and Tto4 in CH4. The time-out periods Tto1 and Tto3 may be the same time. The time-out periods Tto2 and Tto4 may be the same time. The time-out periods Tto2 and Tto4 are longer than the time-out periods Tto1 and Tto3.

(b) of FIG. 9 shows a state in which the noise level does not become less than the threshold value TH (TH1 or TH3) within each of the time-out periods Tto1 to Tto3 in each of CH1 to CH3, and the noise level becomes less than the threshold value TH3 within the time-out period Tto4 in CH4.

In the receiver 100 according to a first embodiment, as described with reference to FIG. 7 or FIG. 8, the timing of generating the noise squelch determination signal indicating that the voice signal is to be unmuted is consistent irrespective of the level of the threshold value TH. Accordingly, it is not necessary to set the time-out periods in response to the level of the threshold value TH. In the receiver 100 according to a first embodiment, the time-out periods can be set to the minimum time in all the channels.

Hence, as shown in (a) of FIG. 9, the time-out periods only need to be set to the minimum time-out period Tto common to CH1 to CH4, and the period taken to perform the channel scanning can be shortened.

Second Embodiment

Figure 10:
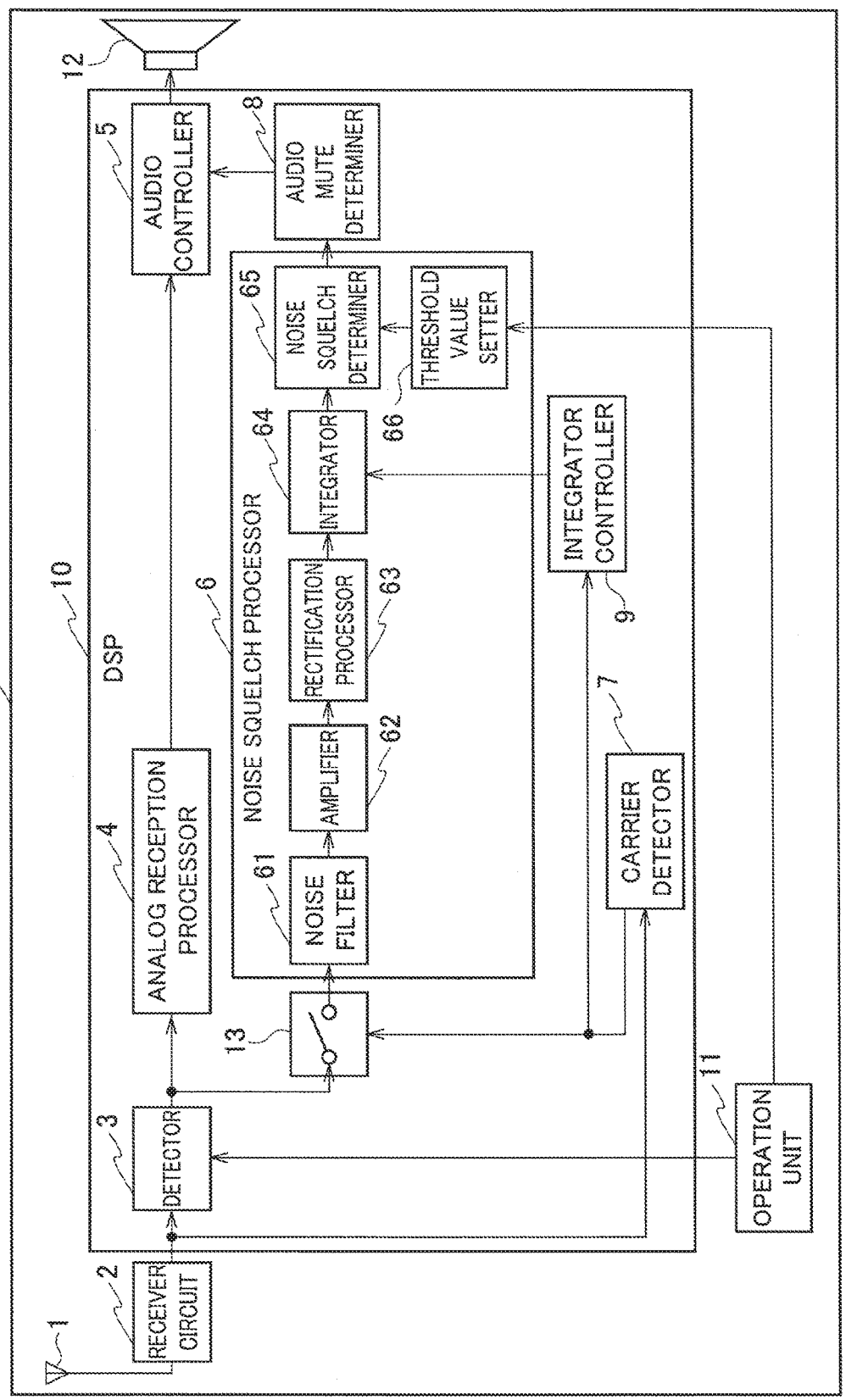
FIG. 10 is a block diagram illustrating a receiver 200 according to a second embodiment.

In the receiver 200 according to a second embodiment, which is shown in FIG. 10, the same reference numerals are assigned to the same portions as those of the receiver 100 according to a first embodiment, which is shown in FIG. 1, and a description thereof is omitted. The receiver 200 according to a second embodiment includes a switch 13 that switches between a state in which the noise squelch processor 6 operates and a state in which the noise squelch processor 6 does not operate, in a stage before the noise squelch processor 6.

The carrier detector 7 supplies the carrier determination signal to the switch 13 and the integrator controller 9. When the carrier determination signal is low indicating that the voice signal is to be muted, the switch 13 is turned off. Hence, the noise squelch processor 6 does not operate while the carrier determination signal is low.

When the carrier determination signal becomes high indicating that the voice signal is to be unmuted, then the switch 13 is turned on, and the noise squelch processor 6 operates. When the carrier determination signal becomes high, the integrator controller 9 sets the cutoff frequency of the integrator 64 to the second cutoff frequency, and returns the cutoff frequency to the first cutoff frequency after an elapse of a predetermined time.

With reference to FIG. 11, a description will be given of operations of the receiver 200 and a noise squelch control method according to a second embodiment. In FIG. 11, the input of the reception signal is started for the receiver 200 at time t70, and the carrier determination signal becomes high at time t71. At time t71, the switch 13 is turned on, and the noise squelch processor 6 operates. Since the noise squelch processor 6 does not operate until t71, the noise level remains at the initial value until time t71.

At time t71, the integrator controller 9 sets the cutoff frequency of the integrator 64 to the second cutoff frequency. As shown by a broken line, the noise level decreases linearly. At time t72, the integrator controller 9 switches the cutoff frequency of the integrator 64 from the second cutoff frequency to the first cutoff frequency. Here, it is assumed that the first and second cutoff frequencies here are the same as the first and second cutoff frequencies described with reference to FIG. 6.

The noise squelch determiner 65 generates the noise squelch determination signal, which rises from low to high, at time t74 when the noise level shown by the broken line becomes less than the threshold value TH3.

Unlike the receiver 100 according to a first embodiment, in the receiver 200 according to a second embodiment, the noise level does not decrease for a period from time t70 to time t71. Accordingly, a period from time t70 to time t74 becomes slightly longer than the period from time t40 to time t43 in FIG. 6. That is, in the receiver 200 according to a second embodiment, the latency of the voice becomes a little longer than in the receiver 100 according to a first embodiment.

Accordingly, if the cutoff frequency is set as follows in the receiver 200 according to a second embodiment, the latency of the voice can be allowed to have the same length as that in the receiver 100 according to a first embodiment. At time t71, the integrator controller 9 sets the cutoff frequency of the integrator 64 to a third cutoff frequency a little higher than the second cutoff frequency. Here, it is assumed that the third cutoff frequency here is different from the third cutoff frequency described with reference to FIG. 8.

Then, as indicated by a solid line, the noise level decreases with a larger inclination than in the broken line. At time t72, the integrator controller 9 switches the cutoff frequency of the integrator 64 from the third cutoff frequency to the first cutoff frequency. The noise squelch determiner 65 generates the noise squelch determination signal, which rises from low to high, at time t73 when the noise level shown by the solid line becomes less than the threshold value TH3.

In this way, the timing when the noise squelch determiner 65 generates the noise squelch determination signal indicating that the voice signal is to be unmuted becomes earlier from time t74 to time t73, and the latency of the voice can be set to the same time as that of the receiver 100 according to a first embodiment.

Instead of setting the cutoff frequency of the integrator 64 to the third cutoff frequency slightly higher than the second cutoff frequency, the period of setting the cutoff frequency of the integrator 64 to the second cutoff frequency may be lengthened.

In accordance with the receiver 200 and the noise squelch control method according to a second embodiment, since the noise squelch processor 6 does not operate when there is no signal, it is possible to reduce the processing load and power consumption.

The present invention is not limited to the above-described first and second embodiments, and a variety of modifications can be made without departing from the scope of the present invention. When the noise squelch processor 6 is composed of the DSP or the CPU, the cutoff frequency of the integrator 64 can be made variable by software.

When the noise squelch processor 6 is composed of a circuit, a circuit constant of at least one of a resistor and a capacitor, which composes the low-pass filter of the integrator 64, is made variable, whereby the cutoff frequency can be made variable. That is, at least one of a variable resistor and a variable capacitor may be used.

What is claimed is:

1. A receiver comprising:
   a noise squelch processor configured to generate a noise level decreasing from an initial value to a predetermined convergence value by integrating, by an integrator composed of a low-pass filter, a rectified signal obtained by extracting and rectifying a signal outside a band of a voice in a detection signal, obtained by detecting a reception signal to determine whether a voice signal is to be muted or unmuted by comparing the noise level and a threshold value with each other, and to generate a noise squelch determination signal;
   a carrier detector configured to generate a carrier determination signal indicating whether or not the reception signal is present based on a signal strength of the reception signal;
   an audio controller configured to supply a voice signal generated based on the detection signal to a speaker;
   an audio mute determiner configured to instruct the audio controller to mute the voice signal when the noise squelch determination signal indicates that the voice signal is to be muted; and
   an integrator controller configured to control the integrator to set a cutoff frequency of the integrator to a second cutoff frequency higher than a first cutoff frequency at first timing when the carrier detector generates a carrier determination signal indicating that the reception signal is present, and to switch the cutoff frequency of the integrator from the second cutoff frequency to the first cutoff frequency at second timing after an elapse of a predetermined period from the first timing.

2. The receiver according to claim 1, wherein the integrator controller is configured to control the integrator to set the cutoff frequency of the integrator to the first cutoff frequency for a period from third timing when input of the reception signal is started to the first timing, and to switch the cutoff frequency of the integrator from the first cutoff frequency to the second cutoff frequency at the first timing.

3. The receiver according to claim 1, further comprising a threshold value setter configured to set, for each of channels, the threshold value to be compared with the noise level by the noise squelch processor,
   wherein the integrator controller is configured to set a value of the second cutoff frequency or a period of setting the cutoff frequency of the integrator to the second cutoff frequency, so that the noise squelch processor makes timing of generating the noise squelch determination signal indicating that the voice signal is to be unmuted common among all the channels in which different threshold values are set.

4. A noise squelch control method comprising:
   generating a rectified signal obtained by extracting and rectifying a signal outside a band of a voice in a detection signal obtained by detecting a reception signal;
   generating a noise level decreasing from an initial value to a predetermined convergence value by integrating the rectified signal by an integrator composed of a low-pass filter;
   determining whether to mute or unmute a voice signal by comparing the noise level and a threshold value with each other and generating a noise squelch determination signal;
   generating a carrier determination signal indicating whether or not a reception signal is present based on a signal strength of the reception signal;
   instructing an audio controller to mute a voice signal generated based on the detection signal when the noise squelch determination signal indicates that the voice signal is to be muted, the audio controller supplying the voice signal to a speaker;
   setting a cutoff frequency of the integrator to a second cutoff frequency higher than a first cutoff frequency at first timing when a carrier determination signal indicating that the reception signal is present; and
   switching the cutoff frequency of the integrator from the second cutoff frequency to the first cutoff frequency at second timing after an elapse of a predetermined period from the first timing.

* * * * *